United States Patent
Kim

(12) 
(10) Patent No.: US 6,518,576 B2
(45) Date of Patent: Feb. 11, 2003

(54) X-RAY IMAGING DEVICE AND DRIVING METHOD THEREOF

(75) Inventor: Chang Yeon Kim, Seoul (KR)

(73) Assignee: LG.Philips LCD Co., Ltd., Seoul (KR)

( * ) Notice: Subject to any disclaimer, the term of this patent is extended or adjusted under 35 U.S.C. 154(b) by 32 days.

(21) Appl. No.: 09/750,249

(22) Filed: Dec. 29, 2000

(65) Prior Publication Data

US 2001/0006545 A1 Jul. 5, 2001

(30) Foreign Application Priority Data

Dec. 31, 1999 (KR) .............................. 99-68050

(51) Int. Cl.[7] ................................. G01T 1/24
(52) U.S. Cl. ............................... 250/370.09
(58) Field of Search ............... 250/370.09; 378/98.8

(56) References Cited

U.S. PATENT DOCUMENTS 5,017,989 A * 5/1991 Street et al. ........... 250/370.09
5,319,206 A * 6/1994 Lee et al. .............. 250/370.09

* cited by examiner

Primary Examiner—Constantine Hannaher
(74) Attorney, Agent, or Firm—McKenna Long & Aldridge LLP

(57) ABSTRACT

An X-ray imaging device having an erasure electrode disposed between an insulating layer and a photo-sensing layer. A switch selectively switches the erasure electrode to ground. Residual charges produce by the X-ray imaging process are discharged to ground after stored charges are readout and used to produce electrical signals for a display.

18 Claims, 6 Drawing Sheets

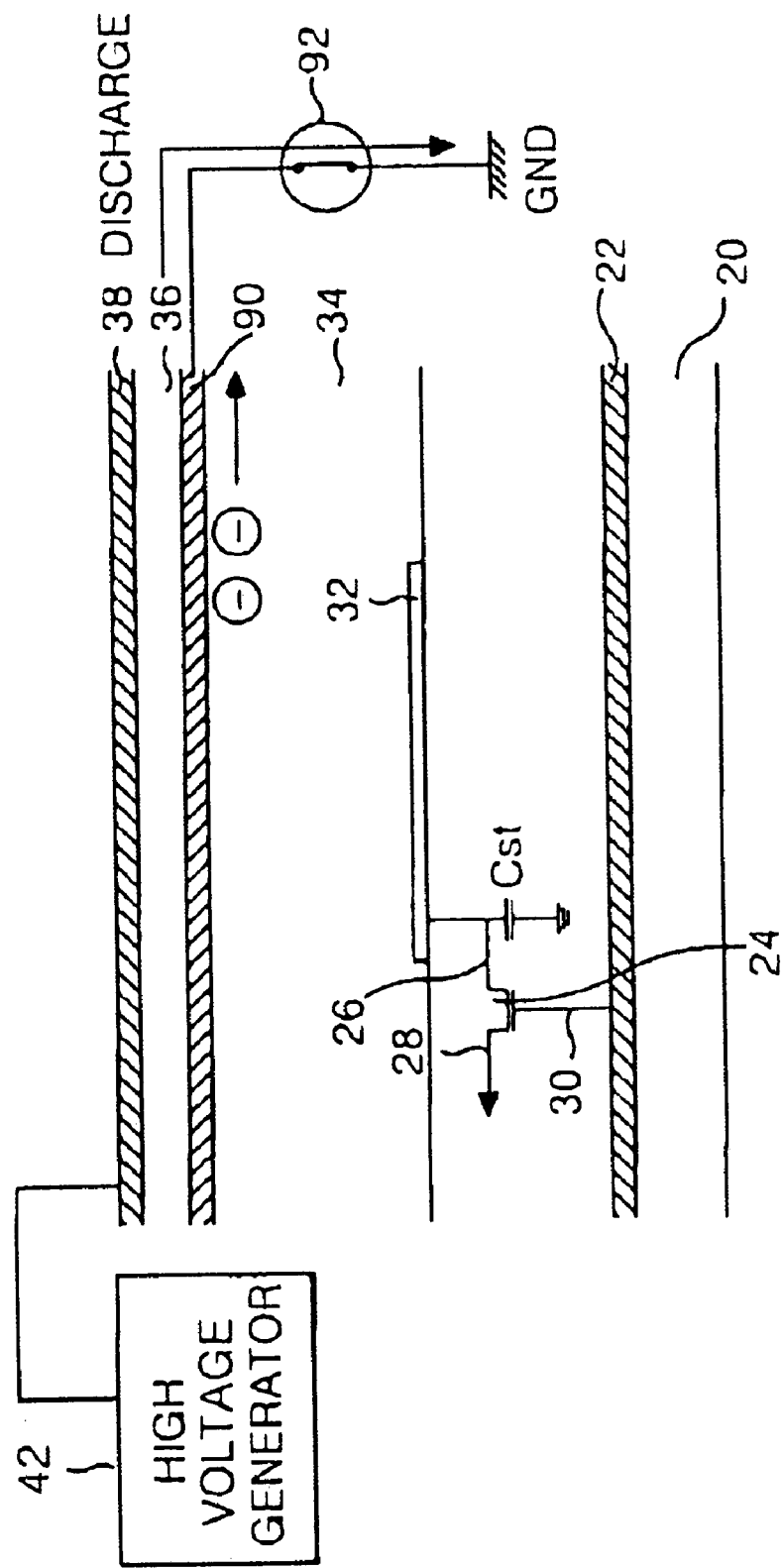

X-RAY IMAGING DEVICE AND DRIVING METHOD THEREOF

This application claims the benefit of Korean Patent Application No. 1999-68050, filed on Dec. 31, 1999, which is hereby incorporated by reference for all purposes as if fully set forth herein.

BACKGROUND OF THE INVENTION

1. Field of the Invention

The present invention relates an X-ray imaging device. More particularly it relates to an X-ray imaging device in which residual charges within a photo-sensing layer are rapidly removed.

2. Discussion of the Related Art

Imaging systems that employ X-rays have been successfully used in medical, scientific and industrial applications. One type of X-ray imaging device uses a photosensitive array panel comprised of a plurality of photo-sensing cells arranged in a matrix. Those cells sense irradiating X-rays that have passed through an object being imaged by generating electric charges in proportion to the intensity of the irradiating X-rays. The electric charges from the photo-sensing cells are sent to a signal converter that converts those charges into electrical signals, that are in turn sent to an image output device. The image output device processes the electrical signals to produce a screen display of the intensity patterns of the X-rays that irradiate the photosensitive array panel.

FIG. 1A schematically illustrates a sectional view of a photo-sensing cell, while FIG. 1B schematically illustrates a planar view of part of a photosensitive array panel. Referring now to FIG. 1A, the photo-sensing cell includes a gate line 22, a thin film transistor (TFT) 24, and a charging capacitor (Cst) that are formed on a glass substrate 20. A pixel electrode 32 electrically connects to a drain electrode 26 of the TFT and to the charging capacitor Cst. A photo-sensing layer 34 is formed on the pixel electrode 32. A dielectric insulating layer 36 is formed on the photo-sensing layer 38, and a conductive upper electrode 38 is formed on the insulating layer 36.

The photo-sensing layer 34 is photoconductive and is used to convert X-rays into electric charges. It is beneficially formed from amorphous selenium having a thickness of hundreds of micrometers.

As shown in FIG. 1A and FIG. 1B, the TFT 24 includes a gate electrode 30 that electrically connects to the gate line 22. Thus, control signals can be applied to the TFT via the gate line 22. The TFT 24 also includes a source electrode 28 that electrically connects to a data line 40 (see FIG. 1B) that is formed on the photo sensitive cell array panel in a direction perpendicular to the gate line 22. The drain electrode 26 electrically connects to the pixel electrode 32.

The pixel electrode 32 is formed within the photo-sensing cell to have an area as large as possible. This enables efficient collection of the electric charges generated in the photo-sensing layer 34 so that they can be stored in the charging capacitor Cst. A high voltage generator 42 connects to the upper electrode 38. That generator supplies a high voltage such that a strong electric field is produced in the photo-sensing layer 34.

In operation, X-rays pass through an object and then irradiate the photo-sensing layer 34. The irradiating X-rays (photons) produce electron-hole pairs within the photo-sensing layer 34. The high voltage (several tens of kV) from the high voltage generator 42 is applied to the upper electrode 38. That high voltage produces an electric field in the photo-sensing layer 34 that causes the electron-hole pairs to separate. The holes are collected by the pixel electrode 32 and then stored in the charging capacitor Cst. The TFT 24 serves as a switch that controls the outflow of stored electric charges in the charging capacitor Cst. When a gate voltage is applied, via the gate line 22, to the gate electrode 30 of the TFT 24, a channel is defined between the source electrode 28 and the drain electrode 26. Electrons stored in the charging capacitor Cst can then pass through the drain electrode 26 and through the source electrode 28 to the data line 40.

Referring now to FIG. 2, an X-ray imaging system includes a driving apparatus that converts the electric charges from the charging capacitors Cst into electrical signals that are applied to an output. The driving apparatus includes a photosensitive array panel 60 having photo-sensing cells 62 that are arranged in a matrix. A gate driver 64 connects to gate lines GL1 through GLm, and a data reader 66 connects to data lines DL1 through DLn. An output 68 displays electrical signals from the data reader 66 as an image.

In the photo sensitive array panel 60, the photo-sensing cells 62 are positioned near intersections of the m gate lines GL1 through GLm and the n data lines DL1 through DLn. Still referring to FIG. 2, each of the photo-sensing cells 62 includes a photo sensor 70, a charging capacitor Cst, and a TFT 72. In each photo-sensing cell 62, a gate electrode 74 of the TFT 72 electrically connects to one of the gate lines GL1 through GLm, and thus to the gate driver 64. Additionally, a source electrode 76 thereof electrically connects to one of the data lines DL1 through DLn, and thus to the data reader 66. Furthermore, a drain electrode of each TFT 72 is connected to a charging capacitor Cst.

When a gate control signal from the gate driver 64 is applied to one of the gate lines GL1 through GLm, the gate electrodes 74 connected to that gate line turn on their associated TFTs 72. Then, a conductive channel is defined between the drain electrode 78 and the source electrode 76 of each of the ON TFTs 72. Thus, the electric charge stored in the charging capacitor Cst of each ON TFT is transferred via one of the data lines DL1 through DLn to the data reader 66. In practice, the gate driver 64 applies a pulse-shaped gate control signal sequentially to each of the m gate lines GL1 through GLm. Thus, the stored electric charges are all applied to the data reader 66 in scan lines.

The data reader 66 generates electrical data signals that correspond to the electric charges from the photo sensitive array panel 60. The data reader 66 sequentially applies groups of n data signals that correspond to the intensity of the X-rays irradiated onto the photo sensitive cell array panel 60, plus a reference signal, to the output 68. The output 68 includes a differential amplifier and an analog-to-digital converter (not shown). The data signals applied to the output 68 are analog signals having noise. The output 68 differentially amplifies the data signals with the reference signal to remove that noise, and then converts the noise-removed analog signal into a digital signal that is suitable for producing an image output on a screen.

As previously mentioned X-rays that irradiate the photo sensitive array panel 60 produce electron-hole pairs in the photo-sensing layer 34. The high voltage from the high voltage generator produces an intense electric field that separates the electron-hole pairs. Thus, as shown in FIG. 1A, holes are collected by the pixel electrode 32 and stored in the charging capacitor Cst. However, the separated electrons accumulate in a region near the boundary between the insulating layer 36 and the photo-sensing layer 34. Such electrons are referred to as "residual charges." The residual charges do not simply disappear, they remain even after the electric charges stored in the charging capacitor Cst have been applied to the data reader 66.

The residual charges have an impact on charges stored in subsequent X-ray irradiations, and thus on subsequent electrical signals. A prior art approach to dealing with residual charges is to irradiate visible light onto the photo sensitive array panel after X-ray irradiation. For example, U.S. Pat. No. 5,563,421 discloses turning off the high voltage applied to the upper electrode 38 after X-ray irradiation and then irradiating the panel with visible light. The visible light produces new electron-hole pairs in the photo-sensing layer 34. The holes tend to re-combine with the residual charges, thus dissipating them. However, this approach has a drawback in that the visible light should be irradiated for tens of seconds, too long a time for many applications, such as producing moving picture displays.

SUMMARY OF THE INVENTION

Accordingly, the present invention is directed to an x-ray imaging device, and to a method of driving that x-ray imaging device, that substantially obviates one or more of the problems due to limitations and disadvantages of the related art.

An object of the present invention is to provide an X-ray imaging device and a driving method thereof wherein residual charges are rapidly removed, beneficially fast enough to produce a moving display.

Additional features and advantages of the invention will be set forth in the description that follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an X-ray imaging device according to one aspect of the present invention includes a system for discharging residual charges into a ground voltage source.

An X-ray imaging device according to another aspect of the present invention includes an erasure electrode between a dielectric layer and a photo-sensing layer that is for accumulating residual charge. The X-ray imaging device further includes a switch that connects the erasure electrode to a ground voltage source. That switch is for controlling the discharge of the accumulated residual charges.

A method of driving an X-ray imaging device according to the principles of the present invention includes discharging residual charges separated from the pixel charges into a ground voltage source. Beneficially, this is performed after the stored charges in cell capacitors have been processed.

It is to be understood that both the foregoing general description and the following detailed description are exemplary and explanatory and are intended to provide further explanation of the invention as claimed.

BRIEF DESCRIPTION OF THE DRAWING

The accompanying drawings, which are included to provide a further understanding of the invention and are incorporated in and constitute a part of this specification, illustrate embodiments of the invention and together with the description serve to explain the principles of the invention.

In the drawings:

FIG. 3A to FIG. 3C are schematic sectional views that illustrate the operation of a photo-sensing cell that is in accord with the principles the present invention.

DETAILED DESCRIPTION OF AN ILLUSTRATED EMBODIMENT

Reference will now be made in detail to an illustrated embodiment of the present invention, an example of which is shown in the accompanying drawings.

Figure 1A:
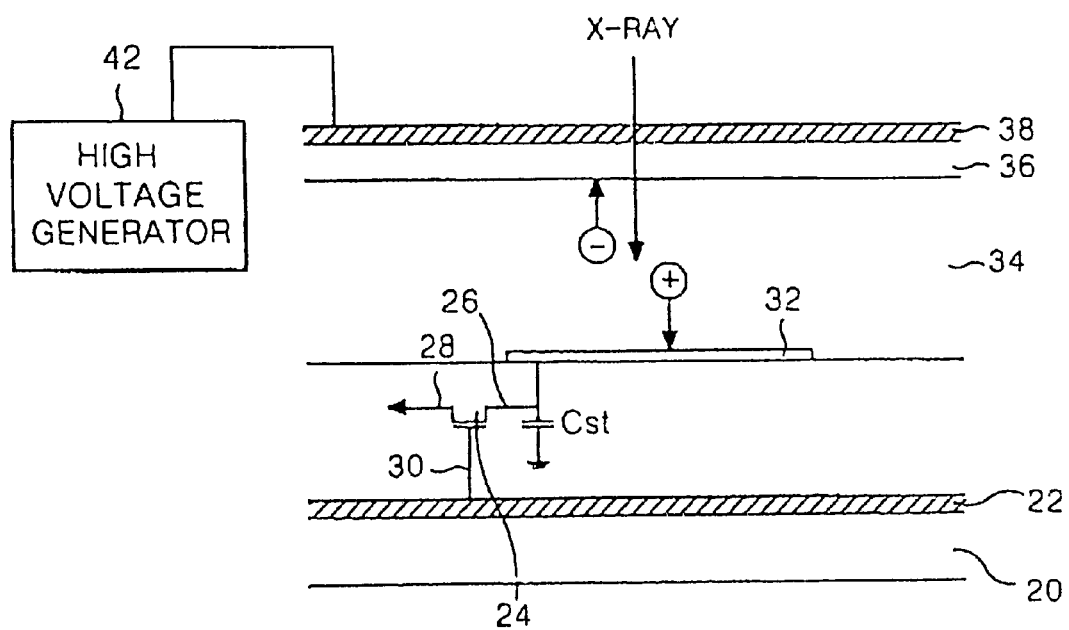
FIGS. 1A and 1B are schematic views that respectively show a sectional view of a photo-sensing cell and a planar view of part of a photo sensitive array panel as in conventional X-ray imaging devices.
Figure 1B:
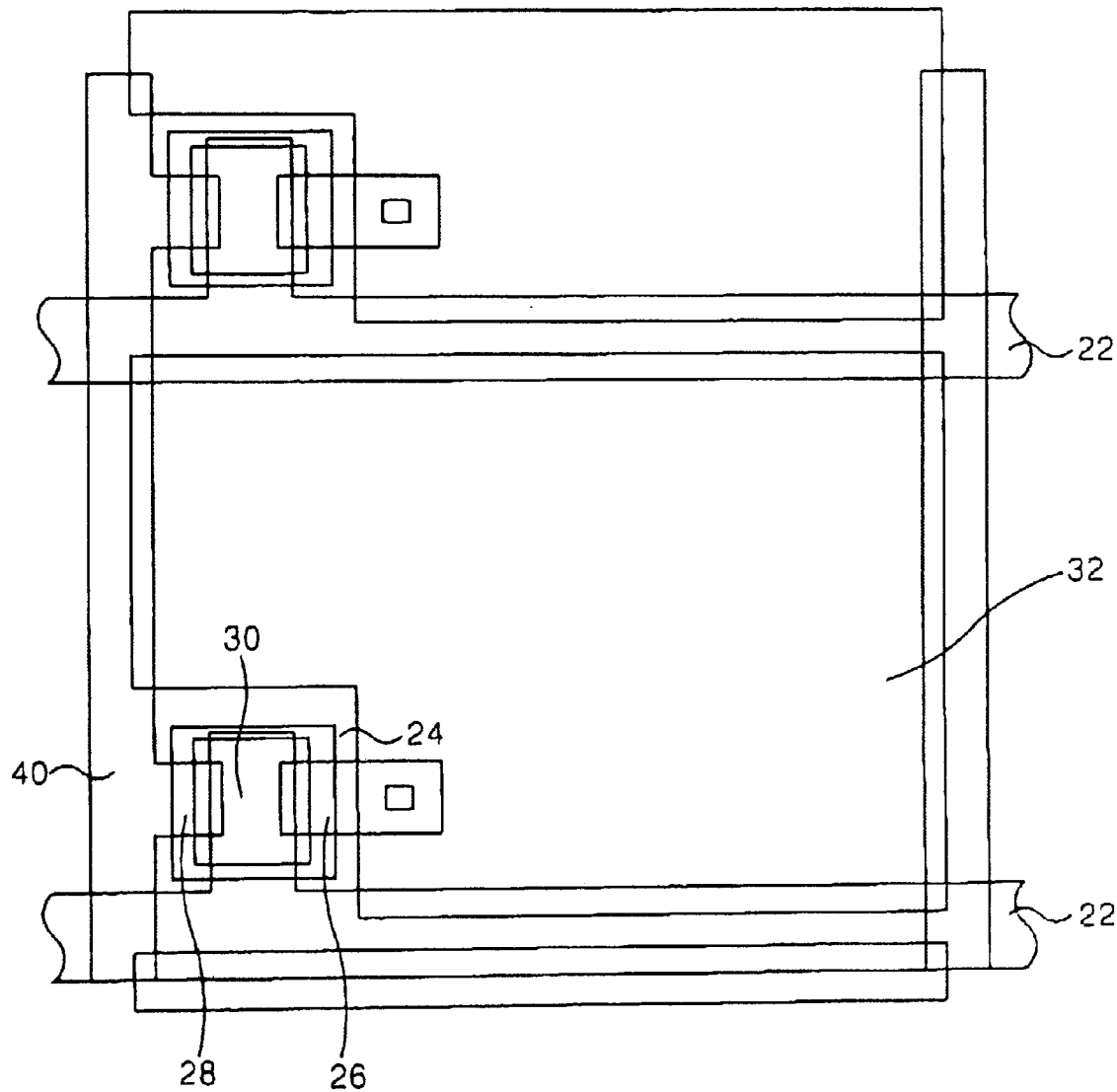
Figure 2:
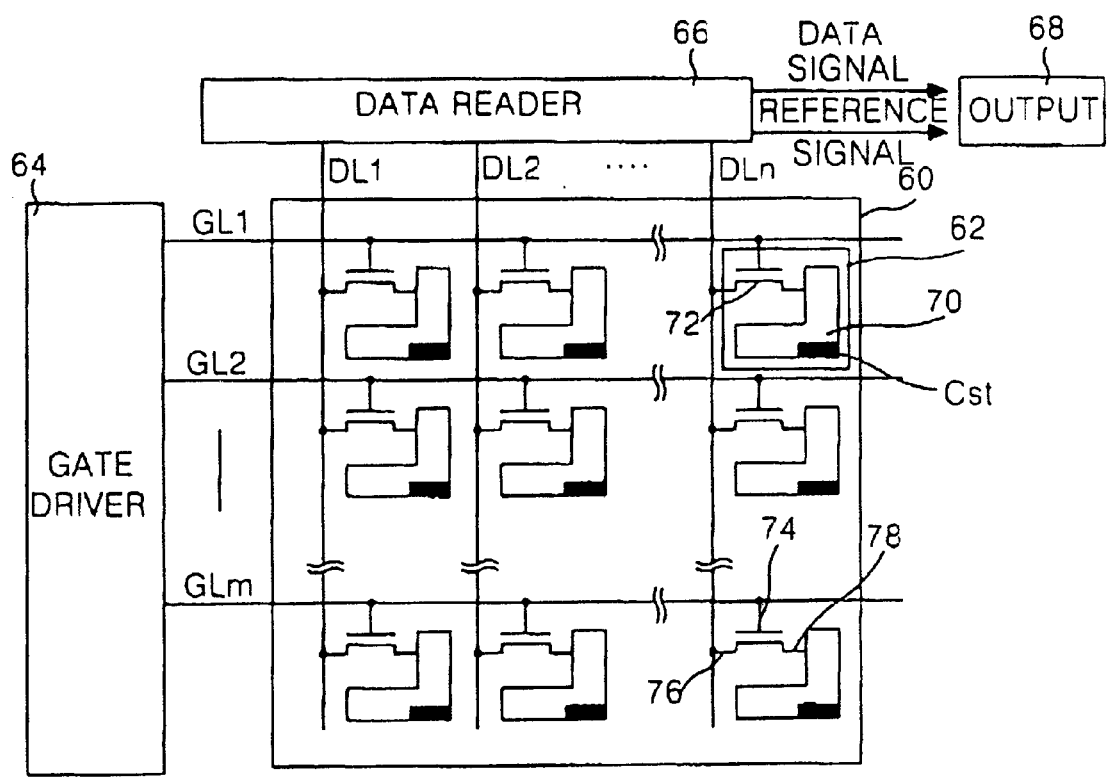
FIG. 2 is a schematic circuit diagram showing a configuration of a conventional X-ray imaging device.
Figure 3A:
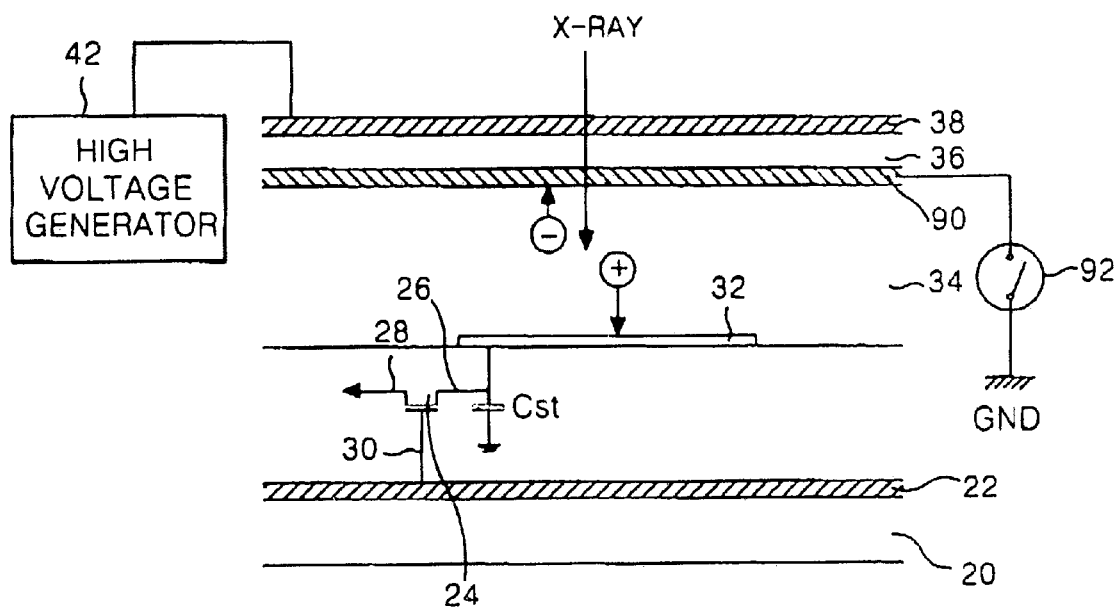

FIG. 3A illustrates a schematic sectional view of a photo-sensing cell of an X-ray imaging device that is in accord with the principles of the present invention. It should be understood that the illustrated photo-sensing cell is simply one cell in a photo sensitive array panel, and that the X-ray imaging device further includes driving circuits and outputs as illustrated generally in FIG. 2. With reference to FIG. 3A, the photo-sensing cell in the X-ray imaging device includes an erasure electrode 90. Further, the X-ray imaging device includes a switch 92 that connects the erasure electrode 90 to a common ground electrode GND.

Other elements and features of the photo-sensing cell are similar to those in the prior art. More specifically, each photo-sensing cell includes an upper electrode 38 on an insulating layer 36. The upper electrode 38 electrically connects to a high voltage generator 42. The erasure electrode 90 is disposed between the insulating layer 36 and a photo-sensing layer 34. The photo-sensing layer 34 produces electron-hole pairs when X-rays are irradiated onto it. A thin film transistor (TFT) 24 having a gate electrode 30, a drain electrode 26, and a source electrode 28, together with a charging capacitor (Cst), a gate line 22, and a pixel electrode 32 are formed on a glass substrate 20. The drain electrode 26, the charging capacitor Cst, and the pixel electrode 32 electrically connect together. Electron-hole pairs formed within the photo-sensing layer 34 by irradiating X-rays are separated by an intense electric field from the upper electrode 38. The holes are collected by the pixel electrode 32 and are stored in the charging capacitor Cst. The TFT 24 serves as a switch for controlling the flow of the stored charges from the charging capacitor Cst as explained above.

A driving apparatus for converting electric charges stored in each photo-sensing cell into electrical signals suitable for use with an output is as shown in FIG. 2. The operation of that driving circuit will be briefly repeated. Gate control signals from a gate driver 64 are sequentially applied to the gate lines GL1 through GLm. Gate electrodes 74 that are connected to the gate line that receives the gate control signal turn on their associated TFT 72. A conductive channel is then defined between the drain electrode 78 and the source electrode 76 of those TFTs. Electric charges stored in the charging capacitor Cst are then transferred to a data reader 66 via data lines DL1 to DLn. The data reader 66 includes n charge amplifiers that convert the flow of electric charges on the data lines DL1 to DLn into electric signals. The data reader 66 sequentially applies the electric signals and a reference signal to the output 68. The output 68 differentially amplifies the electric signals and the reference signal to remove a noise, and converts the resulting noise-removed analog signals into digital signals suitable for producing an image on an output screen.

The erasure electrode 90, disposed between the insulating layer 36 and a photosensing layer 34, is used to discharge residual charges produced by X-ray irradiation into a common ground electrode GND. A switch 92 controls when the erasure electrode 90 is connected to the common ground electrode GND. That switch can be operated by an external control signal.

Figure 3C:
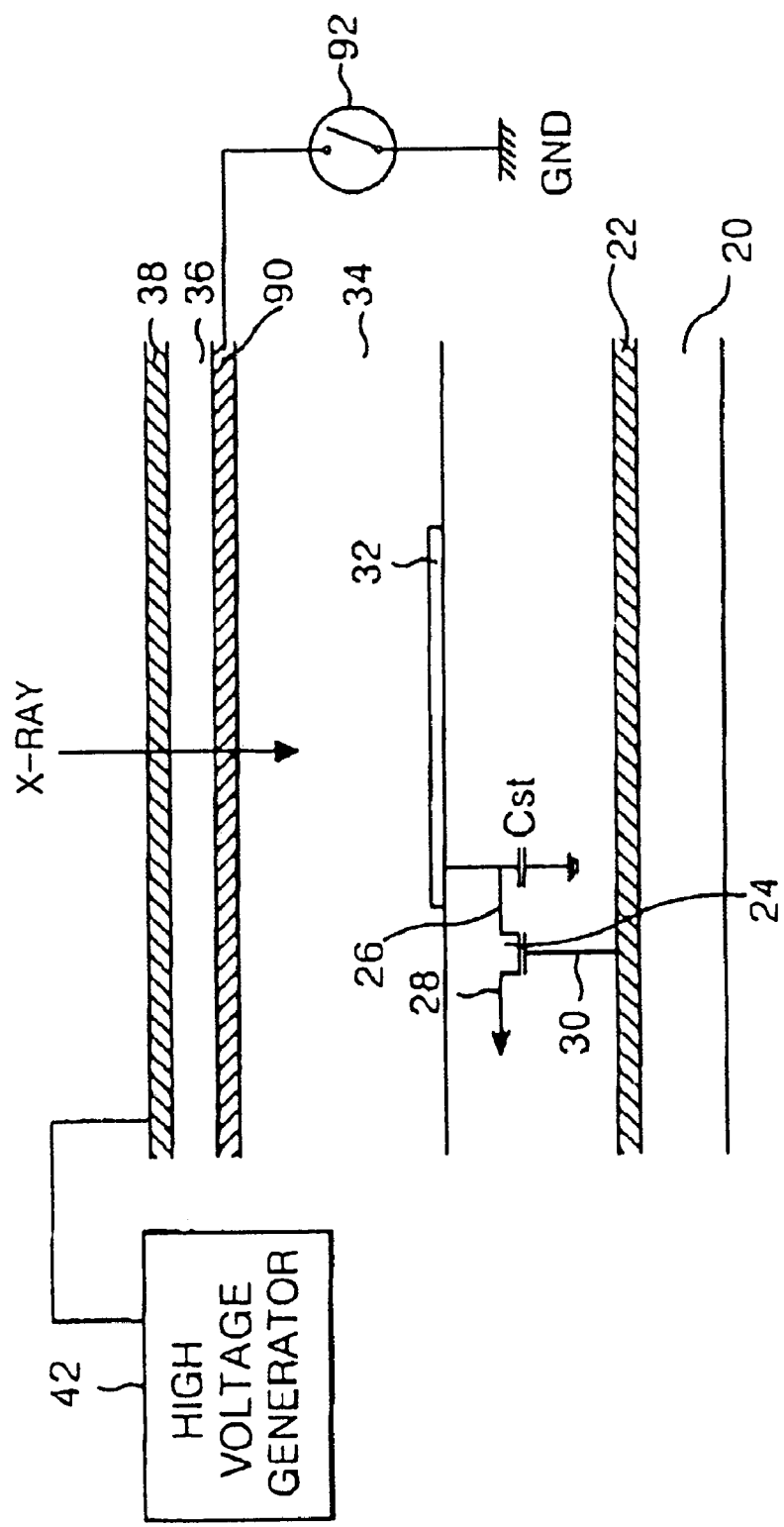

A process of removing residual charges through the erasure electrode 90 will be described with reference to FIG. 3A to FIG. 3C. First, as shown in FIG. 3A, a high voltage of tens of kilovolts is applied from the high voltage generator 42 to the upper electrode 38. At this time the switch 92 is open. With the switch 92 open the erasure electrode 90 has little effect on the formation of electric fields within the photo-sensing layer 34. Then, X-rays that pass through an object produce electron-hole pairs within the photo-sensing layer 34. The electron-hole pairs are separated by the intense electric field at the photo-sensing layer 34. Holes separate from the electrons. Those holes are collected by the pixel electrode 32 and are stored the charging capacitor Cst. The high electric field causes the electrons to accumulate on the erasure electrode 90 as residual charges. The stored charges are then converted to electrical signals as previously described.

When the data reader 68 has finished converting the stored charges to electrical signals, the switch 92 is closed as shown in FIG. 3B. Closure may be performed by an operator or by a control network (not shown). When the switch is closed the accumulated electrons on the erasure electrode 90 are discharged via the common ground electrode GND. Most of the residual charges that accumulated on the erasure electrode 90 are removed in a short time. As shown in FIG. 3C, after the discharge of the residual charges the switch 92 is opened. Additional X-ray imaging can then be performed.

As described above, an X-ray imaging device according to the principles of the present invention rapidly discharges accumulated residual charges using the erasure electrode 90 and the switch 92. Since residual charges does not remain in the photo-sensing layer 34 the problems that residual charges can produce are reduced or eliminated. When compared with the prior art method, in which visible light was irradiated for a long period of time to remove the residual charges, a method according to the principles of the present invention can operate much faster. Also, unlike with the prior art method separate light-irradiating equipment is not required. In addition, the present method is applicable to the production of a moving picture display.

As described above, according to the principles of the present invention, an erasure electrode is provided between the dielectric layer and the photo-sensing layer of a photo-sensing cell. That erasure electrode accumulates residual charges and a switch provides a controlled way of removing them. In operation, the switch is left open during the production and the reading of stored charges. Then, the switch is closed and the residual charges are then discharged to a common ground electrode prior to the next X-ray image re-irradiation. Accordingly, the present invention has advantages in that residual charges are rapidly removed by a switch operation, which can be done at high-speed to enable a moving picture display.

It will be apparent to those skilled in the art that various modifications and variation can be made in the present invention without departing from the spirit or scope of the invention. For example, the foregoing has described electrons as accumulating on the erasure electrode. However, if the potential applied to the upper electrode is reversed, the electrons will be stored in the charging capacitors. So, the particular charge species accumulated by the erasure electrode depends on the particular design. Thus, it is intended that the present invention covers the modifications and variations of this invention provided they come within the scope of the appended claims and their equivalents.

What is claimed is:

1. An X-ray imaging device having a plurality of photo-sensing cells, each of which includes a photo-sensing layer for producing electron-hole pairs by X-ray irradiation, and a capacitor for storing pixel charges formed by separating the electron-hole pairs using an electric field applied to the photo-sensing layer, said device comprising:

discharge means for discharging residual charges separated from the pixel charges into a ground voltage source.

2. The X-ray imaging device according to claim 1, wherein the discharge means includes:

an erasure electrode adjacent the photo-sensing layer; and a switch connected between the erasure electrode and an electrical ground.

3. An X-ray imaging device, comprising:

a photo-sensing layer for producing electron-hole pairs when irradiated by X-rays;

a pixel electrode adjacent said photo-sensing layer, said pixel electrode for collecting a first charge species of produced electron-hole pairs;

a charge capacitor electrically connected to said pixel electrode, said charge capacitor for storing said first charge species collected by said pixel electrode;

an erasure electrode adjacent said photo-sensing layer, said erasure electrode for accumulating a second charge species of produced electron-hole pairs;

a switch electrically connected to said erasure electrode and to a common terminal, said switch for selectively discharging said second charge species accumulated by said erasure electrode; and a thin-film transistor having a gate electrode, a source electrode, and a drain electrode, wherein said drain electrode is electrically connected to said charge capacitor and to said pixel electrode.

4. An X-ray imaging device according to claim 3, further including a dielectric layer adjacent said erasure electrode.

5. An X-ray imaging device according to claim 4, further including a high voltage electrode adjacent said dielectric layer, said high voltage electrode for producing an electric field that separates said electron-hole pairs into said first charge species and into said second charge species.

6. An X-ray imaging device according to claim 5, further including a high voltage generator connected to said high voltage electrode.

7. An X-ray imaging device according to claim 6, further including an X-ray source.

8. An X-ray imaging device according to claim 6, further including a gate drive electrically connected to said gate electrode.

9. An X-ray imaging device according to claim 8, further including a data reader electrically connected to said source electrode.

10. An X-ray imaging device according to claim 9, further including a display electrically connected to said data reader.

11. An X-ray imaging device according to claim 3, further including a gate drive that is electrically connected to said gate electrode.

12. An X-ray imaging device according to claim 3, further including a data reader that is electrically connected to said source electrode.

13. An X-ray imaging device according to claim 12, further including a display that is electrically connected to said data reader.

14. An X-ray imaging device according to claim 3, wherein said first charge species are electrons.

15. An X-ray imaging device according to claim 3, wherein said second charge species are electrons.

16. A method of operating an X-ray imaging device, comprising:

irradiating X-rays onto a photo-sensing layer to produce electron-hole pairs;

applying an electric field across the photo-sensing layer to separate the electron-hole pairs into a first charge species and a second charge species;

storing the first charge species;

accumulating the second charge species on a conductor;

converting the stored first charge species into a voltage signal; and after converting the stored first charge species into a voltage signal, discharging the accumulated second charge species.

17. A method of operating an X-ray imaging device, comprising:

applying an electric field to a photo-sensing layer;

irradiating the photo-sensing layer with X-rays to produce electron-hole pairs;

storing one charge species of the produced electron-hole pairs in a capacitor;

accumulating the residual second charge species on an erasure electrode;

converting the stored charge species into an electrical signal; and switching the erasure electrode to a ground voltage source after the stored charge species is converted into an electrical signal.

18. A method of operating an X-ray imaging device according to claim 17, wherein the erasure electrode is not switched to the ground voltage from a time at which said electric field is applied to the photo-sensing layer until the stored charge species is converted into an electrical signal.

* * * * *